(12) United States Patent
Lee et al.

(10) Patent No.: US 12,469,702 B2
(45) Date of Patent: Nov. 11, 2025

(54) METHODS OF MANUFACTURING SEMICONDUCTOR DEVICES INCLUDING A REPEATING PATTERN OF LINES AND SPACES

(71) Applicant: SAMSUNG ELECTRONICS CO., LTD., Suwon-si (KR)

(72) Inventors: Seungkyo Lee, Suwon-si (KR); Jongin Kang, Suwon-si (KR); Gyeyoung Kim, Suwon-si (KR); Youngwoo Kim, Suwon-si (KR); Yonghan Park, Suwon-si (KR); Woojin Jung, Suwon-si (KR); Seunguk Han, Suwon-si (KR); Juyoung Huh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 294 days.

(21) Appl. No.: 18/136,407

(22) Filed: Apr. 19, 2023

(65) Prior Publication Data

US 2023/0411157 A1    Dec. 21, 2023

(30) Foreign Application Priority Data

Jun. 15, 2022    (KR) .......................... 10-2022-0072567

(51) Int. Cl.
*H01L 21/033*    (2006.01)
*H01L 21/02*    (2006.01)
(Continued)

(52) U.S. Cl.
CPC ...... *H01L 21/0337* (2013.01); *H01L 21/0228* (2013.01); *H01L 21/0271* (2013.01);
(Continued)

(58) Field of Classification Search
None
See application file for complete search history.

(56) References Cited

U.S. PATENT DOCUMENTS 7,701,034 B2    4/2010    Chuang et al.
8,125,051 B2    2/2012    Chuang et al.
(Continued)

FOREIGN PATENT DOCUMENTS

KR    10-1699134    1/2017
TW    201635345    10/2016

OTHER PUBLICATIONS

Office Action issued in corresponding Taiwan application No. TW 112116902 dated Apr. 12, 2024.

*Primary Examiner* — Roberts P Culbert
(74) *Attorney, Agent, or Firm* — MORGAN, LEWIS & BOCKIUS LLP

(57) ABSTRACT

A method of manufacturing a semiconductor device includes: forming a mask layer, a first separation layer, a first mandrel layer, a second separation layer and a second mandrel layer on a substrate; patterning the second mandrel layer to form second mandrel patterns; forming first spacers on the second mandrel patterns; removing the second mandrel patterns; patterning the second separation layer and the first mandrel layer to form first structures; forming a second spacer layer on the first structures and the first separation layer; anisotropically etching the second spacer layer to form second spacers on the first structures, and to form first dummy patterns and align key patterns on the first structures; and spin-coating a spin-on hard mask layer on the first separation layer, wherein the spin-on hard mask layer covers the first structures, the first dummy patterns and the align key patterns.

16 Claims, 15 Drawing Sheets

(51) Int. Cl.
  *H01L 21/027* (2006.01)
  *H01L 21/311* (2006.01)
  *H01L 23/16* (2006.01)
  *H01L 23/544* (2006.01)

(52) U.S. Cl.
  CPC ... *H01L 21/31111* (2013.01); *H01L 21/31144* (2013.01); *H01L 23/16* (2013.01); *H01L 23/544* (2013.01)

(56) References Cited

U.S. PATENT DOCUMENTS

| | | |
|---|---|---|
| 9,594,862 B2 * | 3/2017 | Lin .................... G03F 1/36 |
| 9,761,603 B2 | 9/2017 | Song et al. |
| 9,837,273 B2 | 12/2017 | Lee et al. |
| 9,842,837 B2 | 12/2017 | Chun |
| 10,359,695 B2 | 7/2019 | Lin et al. |
| 10,410,886 B2 | 9/2019 | Kwon et al. |
| 10,854,452 B2 | 12/2020 | Kim et al. |
| 11,024,509 B2 | 6/2021 | Chang et al. |
| 11,061,317 B2 | 7/2021 | Lin et al. |
| 11,119,416 B2 | 9/2021 | Sun et al. |
| 2006/0157702 A1 | 7/2006 | Sukman-Prahofer et al. |
| 2015/0364549 A1 | 12/2015 | Lee et al. |
| 2017/0103891 A1 | 4/2017 | Lee et al. |
| 2017/0345679 A1 | 11/2017 | Kwon et al. |
| 2020/0152461 A1 | 5/2020 | Kim et al. |
| 2020/0234966 A1 * | 7/2020 | Chang ............... H01L 21/3086 |

\* cited by examiner

FIG. 4
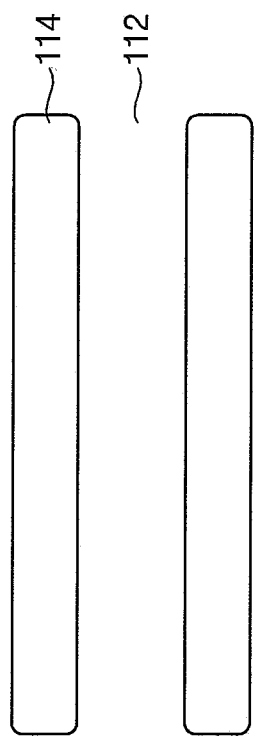
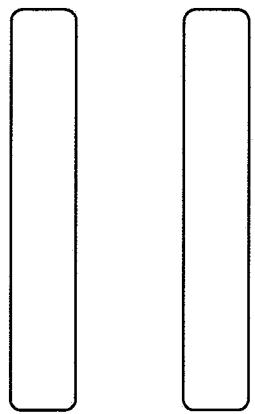
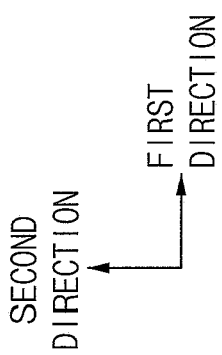

FIG. 8
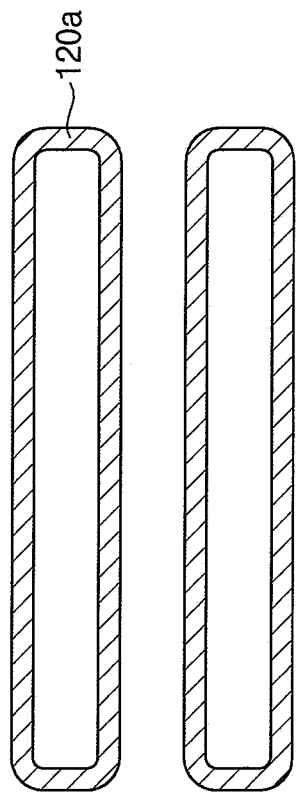
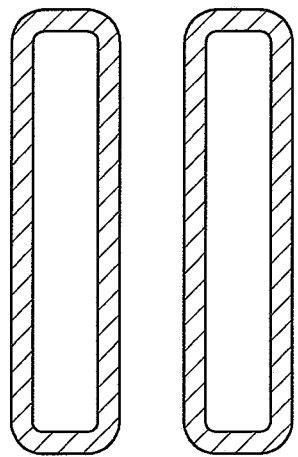
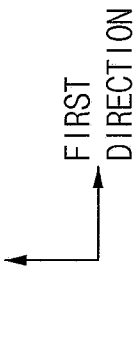

METHODS OF MANUFACTURING SEMICONDUCTOR DEVICES INCLUDING A REPEATING PATTERN OF LINES AND SPACES

CROSS-REFERENCE TO RELATED APPLICATION

This application claims priority under 35 USC § 119 to Korean Patent Application No. 10-2022-0072567 filed on Jun. 15, 2022 in the Korean Intellectual Property Office (KIPO), the disclosure of which is incorporated by reference herein in its entirety.

TECHNICAL FIELD

Example embodiments of the present inventive concept relate to a method of manufacturing semiconductor devices. More particularly, example embodiments of the present inventive concept relate to a method of manufacturing semiconductor devices including a repeating pattern of lines and spaces.

DISCUSSION OF THE RELATED ART

Generally, semiconductor devices may include a repeating pattern of lines and spaces in a main chip region of a substrate. Due to the miniaturization of line widths and spaces of the pattern, it might not be easy to form a pattern having uniform line widths and height throughout the entire region of a substrate.

SUMMARY

Example embodiments of the present inventive concept provide a method of manufacturing a semiconductor device including a repeating pattern of lines and spaces.

According to an example embodiment of the present inventive concept, a method of manufacturing a semiconductor device includes: forming a mask layer, a first separation layer, a first mandrel layer, a second separation layer and a second mandrel layer on a substrate including a main chip region and a scribe lane region; patterning the second mandrel layer to form second mandrel patterns that extend in a first direction and separated from each other on the main chip region and the scribe lane region; forming first spacers on the second mandrel patterns in the main chip region and the scribe lane region; removing the second mandrel patterns; patterning the second separation layer and the first mandrel layer by using the first spacers to form first structures that include a first mandrel pattern and a second separation layer pattern stacked on the first mandrel pattern; forming a second spacer layer on the first structures and on the first separation layer in the main chip region and the scribe lane region; anisotropically etching the second spacer layer to form second spacers on side walls of the first structures of the main chip region, and to form first dummy patterns and align key patterns on the side walls of the first structures of the scribe lane region; and spin-coating a spin-on hard mask layer on the first separation layer, wherein the spin-on hard mask layer covers the first structures, the first dummy patterns and the align key patterns.

According to an example embodiment of the present inventive concept, a method of manufacturing a semiconductor device includes: forming a mask layer, a first separation layer, a first mandrel layer, a second separation layer and a second mandrel layer on a substrate including a main chip region and a scribe lane region; patterning the second mandrel layer to form second mandrel patterns that extend in a first direction and separated from each other on the main chip region and the scribe lane region; forming first spacers on the side walls of the second mandrel patterns in the main chip region and the scribe lane region, wherein the first spacers have a first target line width; removing the second mandrel patterns; patterning the second separation layer and the first mandrel layer using the first spacers to form first structures that include a first mandrel pattern and a second separation layer pattern stacked on the first mandrel pattern and that extend in the first direction; forming a second spacer layer on the first structures and on the first separation layer in the main chip region and the scribe lane region; anisotropically etching the second spacer layer to form second spacers, which have the first target line width, on side walls of the first structures of the main chip region, and to form first dummy patterns, which have the first target line width, and align key patterns, which have the first target line width, on the side walls of the first structures of the scribe lane region; spin-coating a spin-on hard mask layer on the first separation layer, wherein the spin-on hard mask layer covers the first structures, the first dummy patterns and the align key patterns; forming a photoresist pattern on the spin-on hard mask layer, wherein the photoresist pattern exposes the main chip region; removing the first structures and the spin-on hard mask layer in the main chip region by using the photoresist pattern as an etching mask; and etching the mask layer using the second spacers in the main chip region as an etching mask to form mask patterns.

According to an example embodiment of the present inventive concept, a semiconductor device includes: a substrate comprising a main chip region and a scribe lane region; a cell pattern structure formed on the main chip region of the substrate, and spacers that extend in a first direction are separated from each other and repeatedly arranged; a dummy pattern structure formed the scribe lane region of the substrate, wherein first dummy patterns that extend in the first direction are separated from each other and repeatedly arranged; and an align key pattern structure formed on the scribe lane region of the substrate, wherein align key patterns that extend in the first direction are separated from each other and repeatedly arranged.

BRIEF DESCRIPTION OF THE DRAWINGS

The above and other features of the present inventive concept will become more apparent by describing in detail example embodiments thereof, with reference to the accompanying drawings, in which:

FIGS. 2, 3, 4, 5, 6, 7, 8, 9, 10, 11, 12, 13, 14, 15, 16 and 17 are cross-sectional views and plan views showing the method of manufacturing a semiconductor device in accordance with an example embodiment of the present inventive concept;

DETAILED DESCRIPTION OF THE EMBODIMENTS

Hereinafter, example embodiments of the present inventive concept will be described in detail with reference to the accompanying drawings.

Hereinafter, a direction parallel to the surface of a substrate will be referred to as a first direction, and a direction parallel to the surface of the substrate and crossing the first direction will be referred to as a second direction. In addition, a direction vertical to the surface of a substrate will be referred to as a vertical direction.

Figure 1:
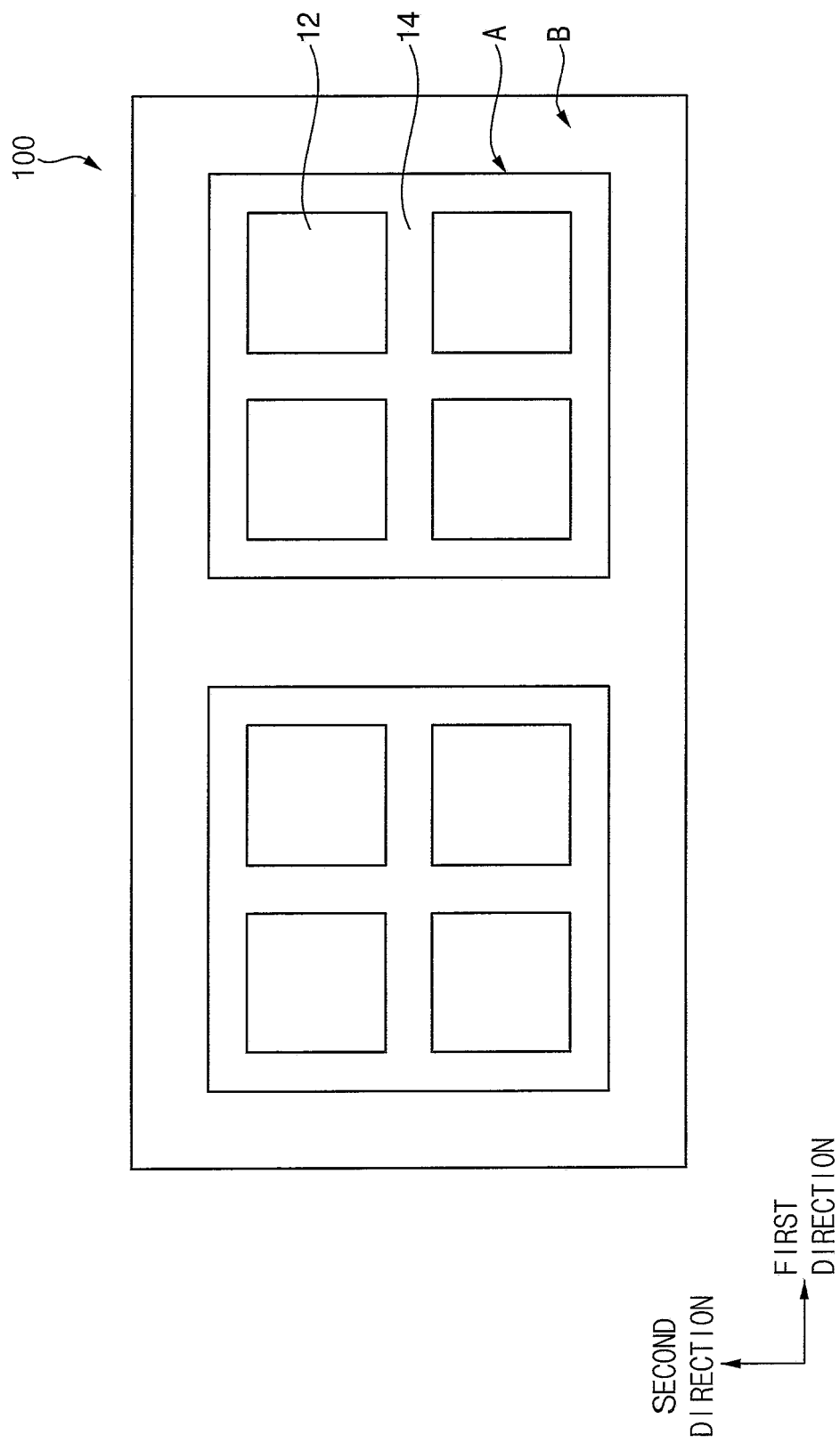
FIG. 1 is a plan view showing each region of a substrate.

FIG. 1 is a plan view showing each region of a substrate.

FIG. 2 to FIG. 17 are cross-sectional views and plan views showing a method of manufacturing a semiconductor device in accordance with an example embodiment of the present inventive concept.

In FIG. 2 to FIG. 17, the cross-sectional views represent the cross-sections of a main chip region and a scribe lane region, and the plan views represent the scribe lane region.

Referring to FIG. 1, a substrate 100 including a main chip region A and a scribe lane region B is provided.

The main chip region A is a region for forming semiconductor devices, and the scribe lane region B is a region disposed between the main chip regions. In the main chip region A, a cell block region 12 on which cells (for example, memory cells) are formed by the subsequent processes, and a cell block division region 14 may be provided between the cell block regions 12. In the cell block region 12, patterns constituting the cells may be formed by the subsequent processes. In the scribe lane region B, dummy patterns and align key patterns may be formed by the subsequent processes.

The substrate 100 may include a single crystal semiconductor material. The substrate 100 may include a semiconductor material such as silicon, germanium and silicon-germanium. In an example embodiment of the present inventive concept, the substrate 100 may be single crystal silicon.

Figure 2:
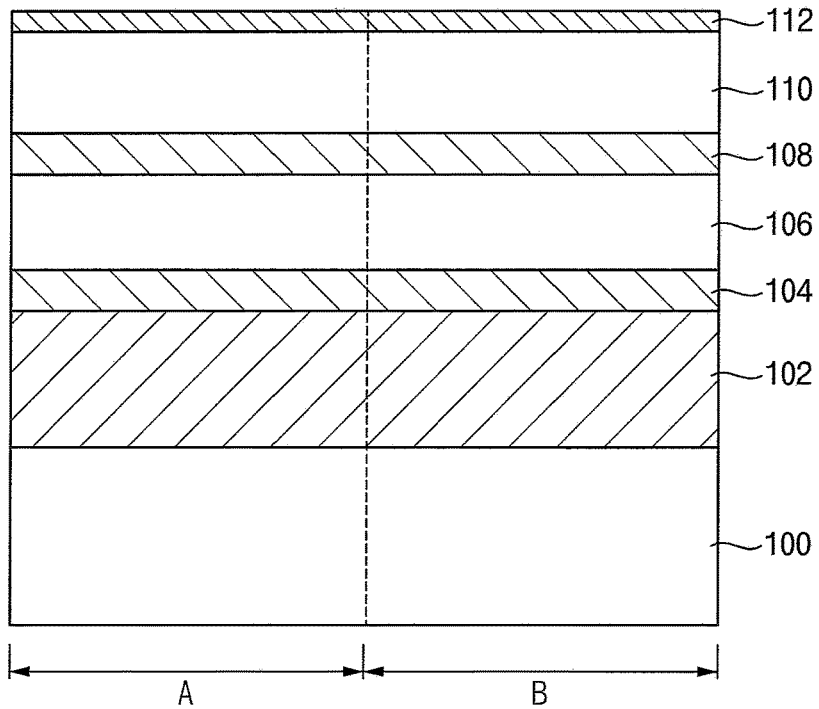

Referring to FIG. 2, a first mask layer 102, a first separation layer 104, a first spin-on hard mask layer 106, a second separation layer 108, a second spin-on hard mask layer 110 and a third separation layer 112 may be sequentially stacked on the substrate 100.

In an example embodiment of the present inventive concept, the first mask layer 102 may be formed on the substrate 100. For example, the first mask layer 102 may be in contact with the substrate 100. In this case, an etching target layer may be the substrate 100. In an example embodiment of the present inventive concept, an etching target layer may be provided between the substrate 100 and the first mask layer 102.

The first mask layer 102 may be provided as a mask for etching an etching target layer. The first mask layer 102 may include a material having an etching selectivity with respect to the etching target layer.

In an example embodiment of the present inventive concept, the etching target layer may be a silicon nitride and/or the substrate, and in this case, the first mask layer 102 may include, for example, a silicon oxide layer.

The first separation layer 104 may be disposed between the first mask layer 102 and a first spin-on hard mask layer 106, and may be provided to divide the first mask layer 102 and the first spin-on hard mask layer 106. The first separation layer 104 may include silicon oxynitride or silicon nitride. The first separation layer 104 may be formed with a thickness that is smaller than a thickness of the first spin-on hard mask layer 106.

The first spin-on hard mask layer 106 may be provided as a mandrel layer for forming a second spacer in the subsequent process. The first spin-on hard mask layer 106 may include, for example, amorphous carbon. The first spin-on hard mask layer 106 may have an etching selectivity with respect to the second spacer, may be formed by spin coating and may be removed easily.

The second separation layer 108 may be provided to divide the first and second spin-on hard mask layers 106 and 110. In addition, the second and third separation layers 108 and 112 may be provided as anti-reflection layers.

Each of the second separation layer 108 and the third separation layer 112 may include, for example, silicon oxynitride or silicon nitride. Each of the second and third separation layers 108 and 112 may be formed with a thickness smaller than a thickness of the second spin-on hard mask layer 110.

The second spin-on hard mask layer 110 may be provided as a mandrel layer for forming a first spacer in the subsequent process. The second spin-on hard mask layer 110 may include, for example, amorphous carbon. The second spin-on hard mask layer 110 may have an etching selectivity with respect to the first spacer, may be formed by spin coating and may be removed easily.

Figure 3:
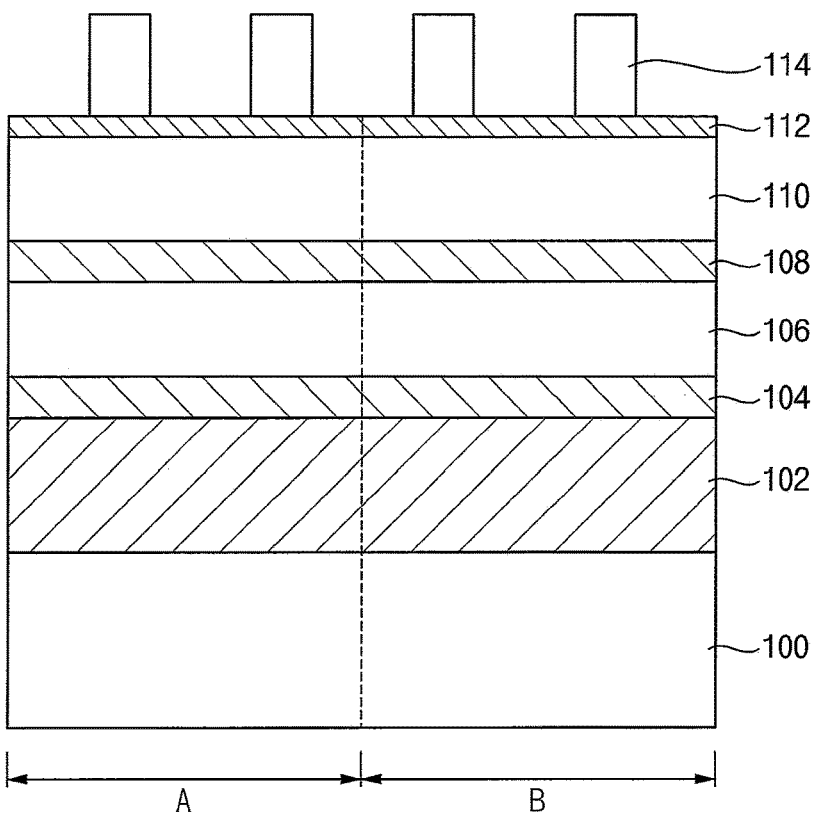

Referring to FIG. 3 and FIG. 4, a first photoresist pattern 114 may be formed on the third separation layer 112 of the main chip region A and the scribe lane region B.

In example embodiments, the first photoresist pattern 114 may include multiple lines extended in a first direction, and the lines may be separated from each other and arranged with a certain gap therebetween in a second direction.

The first photoresist pattern 114 may have a line width that is about three times the first line width of a target line width of a second spacer that is to be formed. In addition, the gap portion between the first photoresist patterns 114 may have a line width that is about five times the first line width.

As described above, on the third separation layer 112 of the main chip region A and the scribe lane region B, a first photoresist pattern 114 with repeating lines and spaces may be formed.

Figure 5:
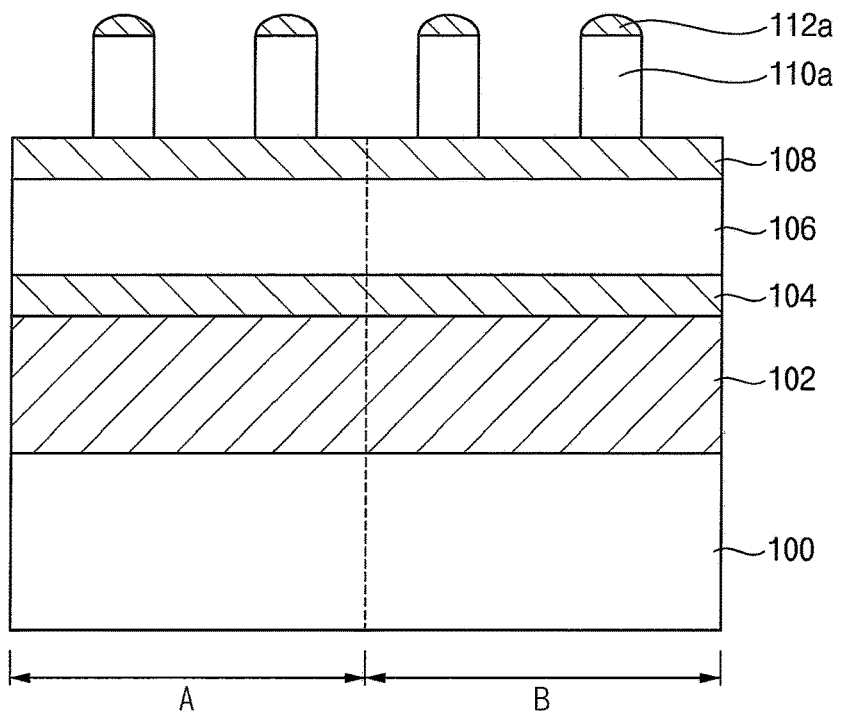

Referring to FIG. 5, the third separation layer 112 and the second spin-on hard mask layer 110 may be etched in order using the first photoresist pattern 114 as an etching mask. Accordingly, a first mandrel pattern 110a and a third separation layer pattern 112a may be formed on the second separation layer 108 of the main chip region A and the scribe lane region B.

The stacked structure of the first mandrel pattern 110a and the third separation layer pattern 112a may be formed by the transcription of the first photoresist pattern 114, and may be arranged so as to repeat lines and spaces of the first photoresist pattern 114.

After that, the first photoresist pattern 114 may be removed.

Figure 6:
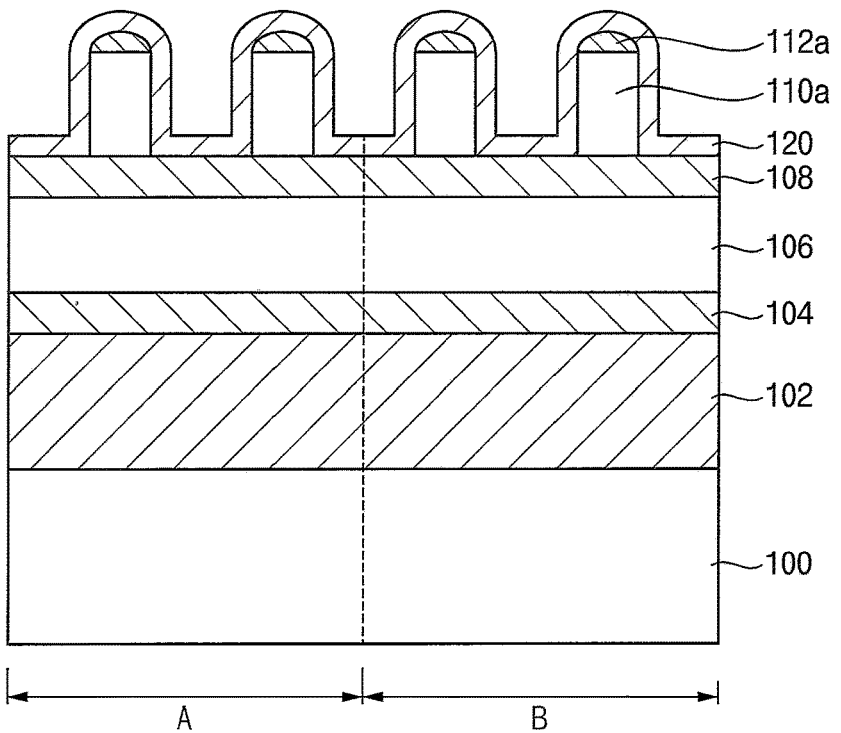

Referring to FIG. 6, a first spacer layer 120 may be formed on the first mandrel pattern 110a, the third separation layer pattern 112a and the second separation layer 108. The first spacer layer 120 may be formed along the surface profile of the first mandrel pattern 110a, the third separation layer pattern 112a and the second separation layer 108.

The first spacer layer 120 may be provided as an etching mask for etching the second separation layer 108 and the first spin-on hard mask layer 106, formed thereunder. In an example embodiment of the present inventive concept, the first spacer layer 120 may include silicon oxide.

In an example embodiment of the present inventive concept, the first spacer layer 120 may be deposited to have substantially the same thickness as the first line width. To form the first spacer layer 120 to a relatively thin thickness, the first spacer layer 120 may be formed through an atomic layer deposition method (ALD).

Figure 7:
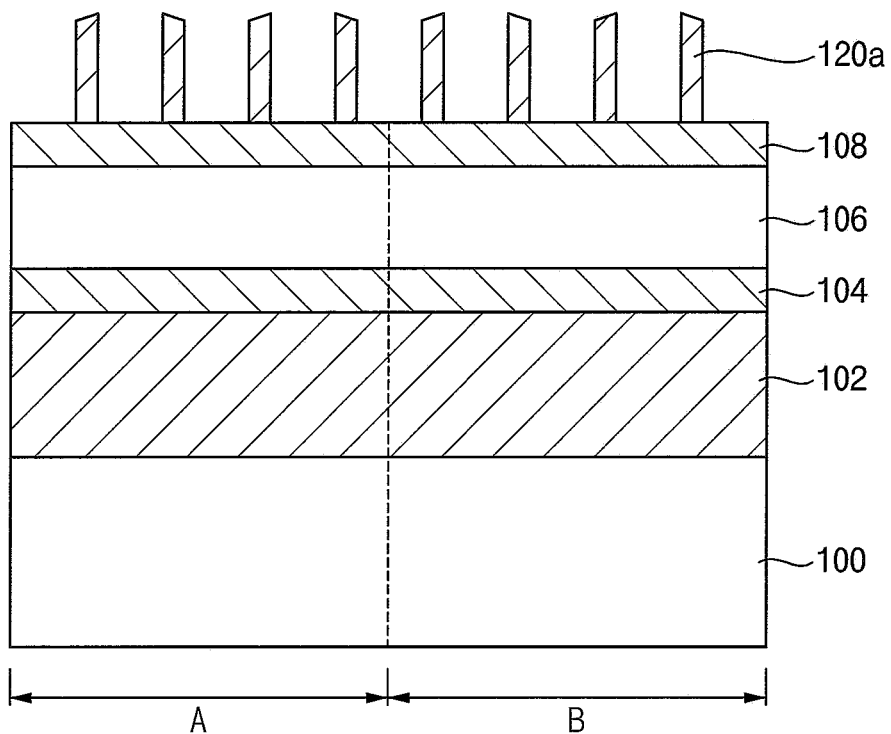

Referring to FIG. 7 and FIG. 8, the first spacer layer 120 may be anisotropically etched to form a first spacer 120a on the side walls of the first mandrel pattern 110a and the third separation layer pattern 112a of the main chip region A and the scribe lane region B.

After forming the first spacer layer 120, an anisotropic etching process may be performed without performing a separate photolithography process to open a specific portion. Accordingly, the first spacer 120a having substantially the same shape as each other may be formed in the main chip region A and the scribe lane region B. For example, a plurality of first spacers 120a may be formed with substantially the same shape as each other.

In an example embodiment of the present inventive concept, the first spacer 120a may have a first line width. The gap between the first spacers 120a may be about three times the first line width.

Then, the third separation layer pattern 112a and the first mandrel pattern 110a may be selectively removed. Accordingly, the first spacers 120a on the second separation layer 108 of the main chip region A and the scribe lane region B may be separated by the same gap from each other. The first spacer 120a may be extended in the first direction. The gap between the first spacers 120a may be about three times the first line width.

Figure 9:
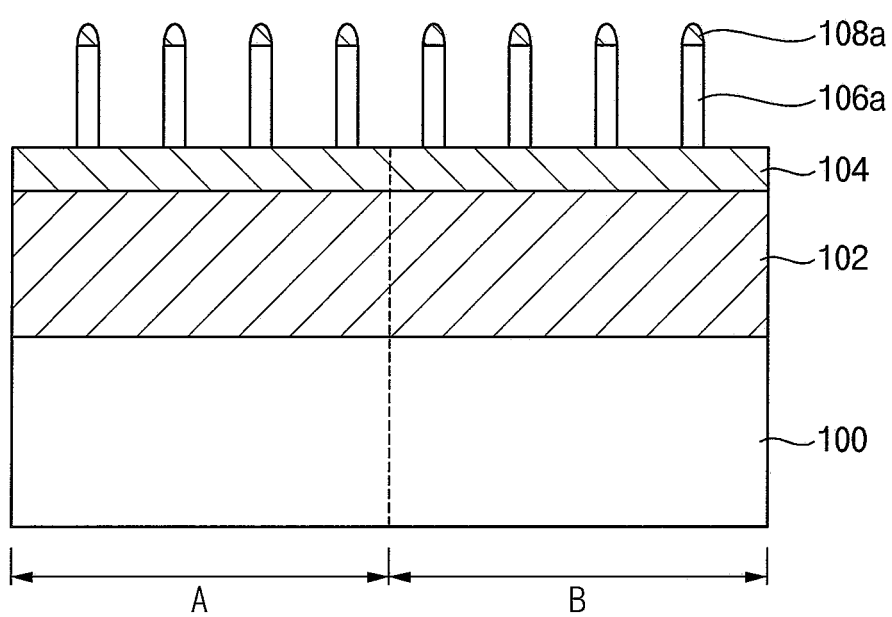

Referring to FIG. 9, the second separation layer 108 exposed between the first spacers 120a may be anisotropically etched using the first spacers 120a as an etching mask to form a second separation layer pattern 108a.

The first spin-on hard mask layer 106 may be etched using the first spacer 120a and the second separation layer pattern 108a as an etching mask. Accordingly, a first structure, in which a second mandrel pattern 106a and a second separation layer pattern 108a are stacked on the first separation layer 104, may be formed. Through performing the process, the first spacer 120a may be removed, and a portion of the upper part of the second separation layer pattern 108a may also be removed.

The second mandrel patterns 106a may have the same shape and the same arrangement as each other on the main chip region A and on the scribe lane region B.

Since the first structure, in which the second mandrel pattern 106a and the second separation layer pattern 108a are stacked, is formed via transcription of the first spacer 120a, the first structures may have a repeating arrangement of lines and spaces. The line width of the second mandrel patterns 106a may be about three times the first line width, and the gap between the second mandrel patterns 106a may be about five times the first line width.

Figure 10:
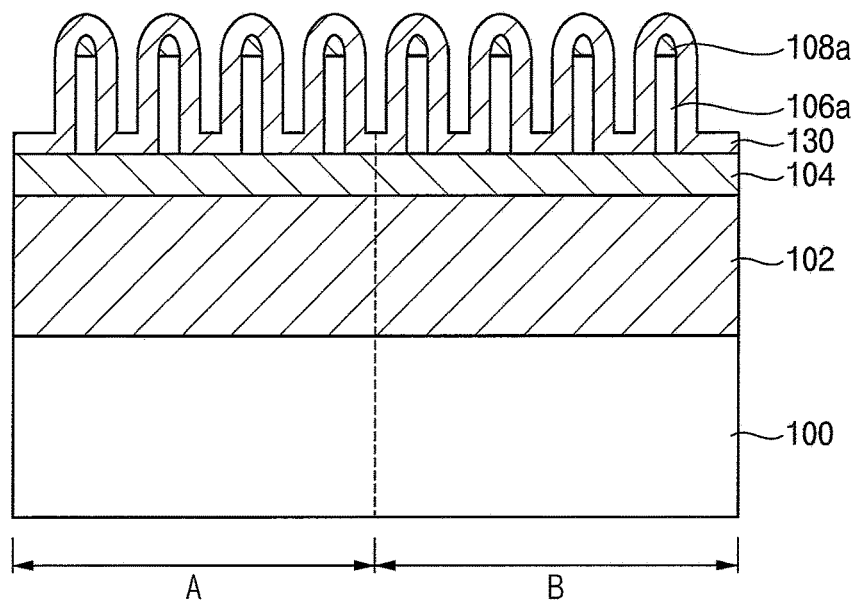

Referring to FIG. 10, a second spacer layer 130 may be formed on the surface of the second mandrel pattern 106a, the second separation layer pattern 108a and the first separation layer 104. The second spacer layer 130 may be formed along the surface profile of the second mandrel pattern 106a, the second separation layer pattern 108a and the first separation layer 104.

The second spacer layer 130 may be provided as an etching mask for etching the first separation layer 104 formed thereunder. Accordingly, the second spacer layer 130 may include a material having an etching selectively with respect to the first separation layer 104. In an example embodiment of the present inventive concept, the second spacer layer 130 may include silicon oxide.

The second spacer layer 130 may be deposited to have substantially the same thickness as the first line width. To form the second spacer layer 130 into a relatively thin thickness, the second spacer layer 130 may be formed through an atomic layer deposition method (ALD).

Figure 11:
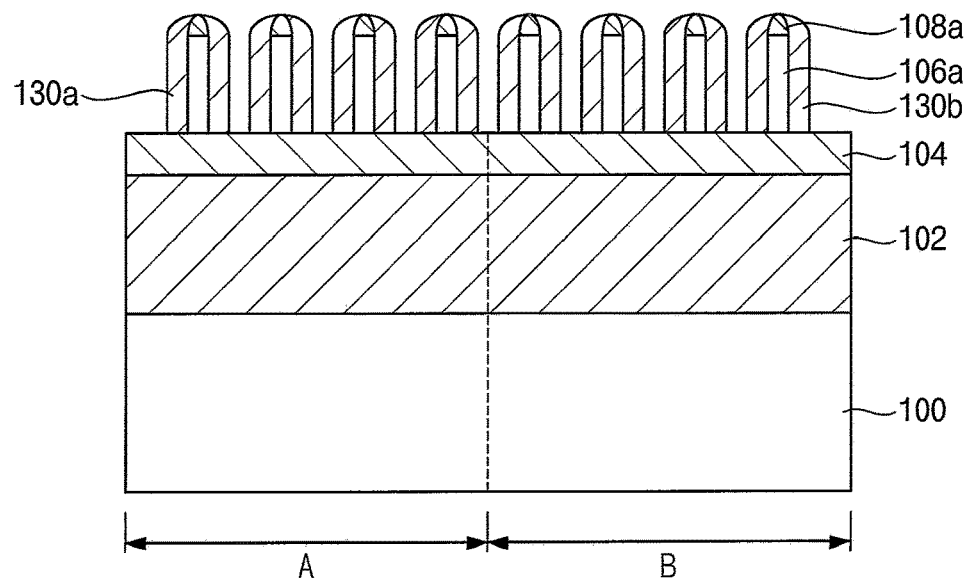
Figure 12:
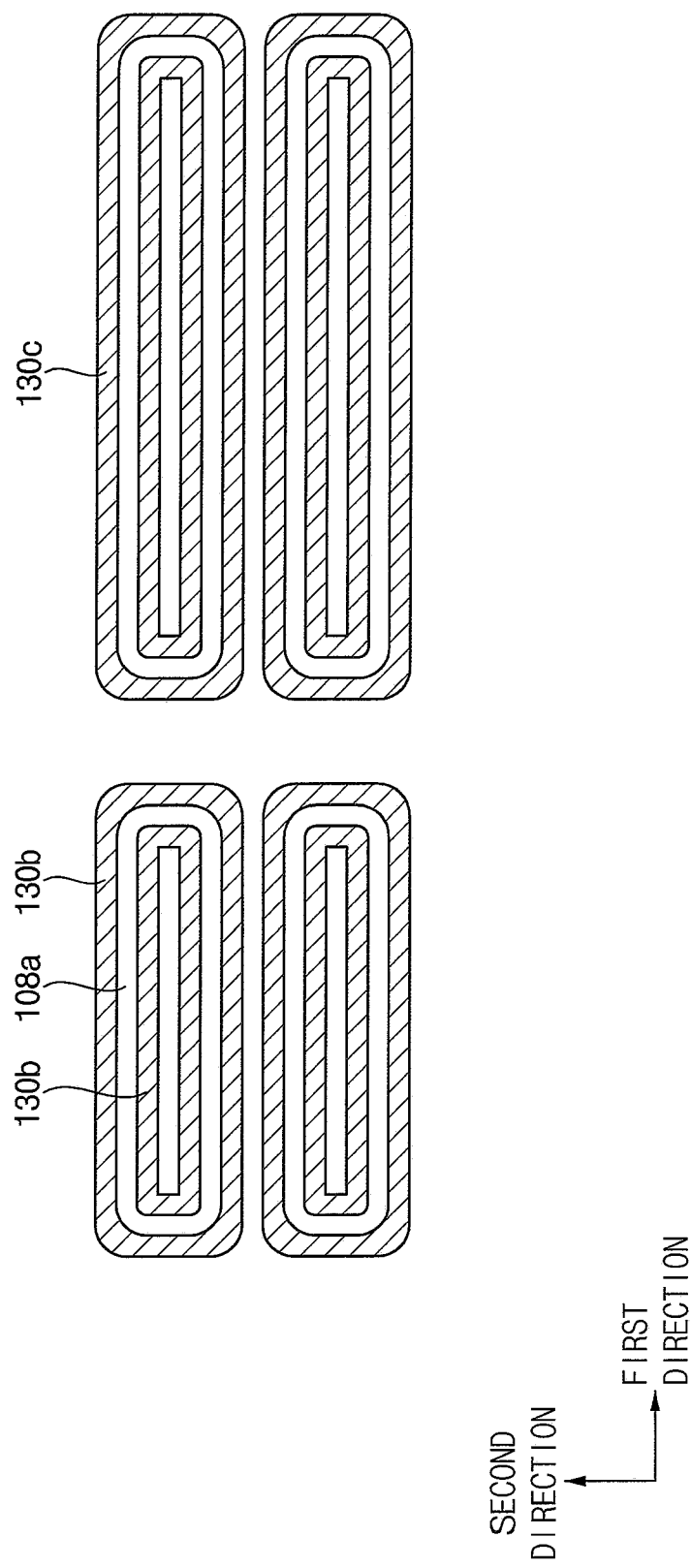

Referring to FIG. 11 and FIG. 12, the second spacer layer 130 may be anisotropically etched to form second spacers 130a on the side wall of the first structure of the main chip region A and to form first dummy patterns 130b and align key patterns 130c on the side walls of the first structures of the scribe lane region B.

Like this, the first dummy patterns 130b and the align key patterns 130c of the scribe lane region B may be formed without performing a separate photolithography process. Accordingly, the second spacer 130a of the main chip region A, and the first dummy patterns 130b and the align key patterns 130c of the scribe lane region B may have the same shape as each other. The second spacer 130a of the main chip region A and the first dummy patterns 130b and the align key patterns 130c of the scribe lane region B may have the same arrangement as each other. In the scribe lane region B, the first dummy patterns 130b and the align key patterns 130c may be formed according to the position, and they have the same cross-sectional shape as each other. Accordingly, the first dummy patterns 130b are shown in each cross-sectional view.

The sum of one line width of the second spacer 130a and one gap of the second spacer 130a may be a first pitch. The first pitch of the second spacer 130a may be about two times the first line width.

In an example embodiment of the present inventive concept, the sum of one line width of the first dummy pattern 130b and one gap of the first dummy pattern 130b may be a second pitch that is the same as the first pitch. The sum of one line width of the align key pattern 130c and one gap of the align key pattern 130c may be a third pitch that is the same as the first pitch. For example, the second spacer 130a, the first dummy pattern 130b and the align key pattern 130c may have the same pitch as each other.

In an example embodiment of the present inventive concept, the second spacer 130a may have the first line width, and the gap of the second spacer 130a may be the same as the first line width. The first dummy pattern 130b may have the first line width, and the gap of the first dummy pattern 130b may be the same as the first line width. The align key pattern 130c may have the first line width, and the gap of the align key pattern 130c may be the same as the first line width.

The second spacers 130a, the first dummy patterns 130b and the align key patterns 130c may extend in the first direction. The second spacer 130a, the first dummy patterns 130b and the align key patterns 130c may have a repeating arrangement of lines and spaces.

The second spacer 130a may also be formed on the side wall of the first structure in the cell block division region in the main chip region A. The second spacer 130a may be provided as second dummy patterns. The second dummy patterns may have a shape extending in the first direction. The second dummy patterns may have a repeating arrangement of lines and spaces. In an example embodiment of the present inventive concept, the second dummy patterns may have the same pitch as that of the second spacer 130a. In an example embodiment of the present inventive concept, the second dummy patterns may have the same line width as that of the second spacer 130a.

The first dummy patterns 130b may have the same dense arrangement as that of the second spacer 130a of the main chip region A. Like this, since the first dummy patterns 130b having the same arrangement as that of the first dummy patterns 130b are formed around the align key pattern, defects of the align key pattern 130c may be reduced, and the align key pattern 130c may be normally formed.

As described above, the second spacer 130a, the first dummy patterns 130b and the align key patterns 130c, extending in the first direction may be formed on the substrate 100. Accordingly, there may be no patterns extending in a direction different from the first direction (for example, a second direction or an oblique direction with respect to the first direction) on the substrate 100.

Figure 13:
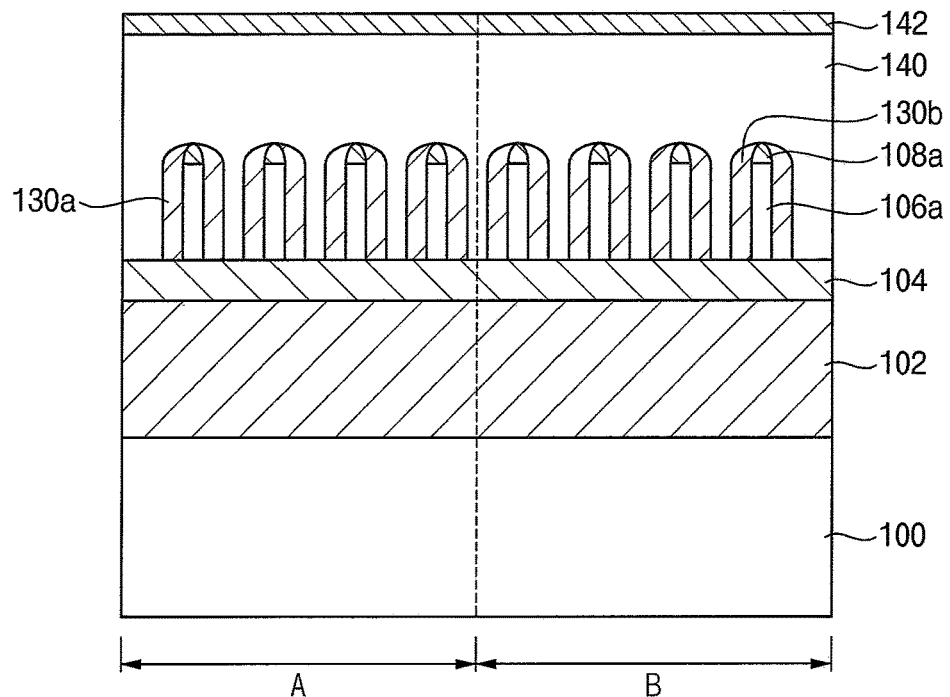

Referring to FIG. 13, a third spin-on hard mask layer 140 covering the first separation layer 104, the second separation layer pattern 108a, the second spacer 130a, the first dummy patterns 130b and the align key pattern 130c may be formed on the first separation layer 104, the second separation layer pattern 108a, the second spacer 130a, the first dummy patterns 130b and the align key pattern 130c. The third spin-on hard mask layer 140 may be formed to fill the gaps between the second spacer 130a, the first dummy patterns 130b and the align key patterns 130c. The third spin-on hard mask layer 140 may include, for example, amorphous carbon.

The third spin-on hard mask layer 140 may be formed through a spin coating process. For example, the third spin-on hard mask layer 140 may be formed by flowing a spin-on hard mask material radially from the center portion of the substrate 100 toward the edge portion of the substrate 100. In this case, the resistance may act differently while flowing the spin-on hard mask material according to the direction of the patterns formed on the substrate 100. At a portion where the resistance increases, the third spin-on hard mask layer 140 may be relatively thicker. For example, line patterns extending in the second direction may apply high resistance to the spin-on hard mask material. Accordingly, if line patterns extending in the second direction are formed on the substrate 100, radial defects, by which the thickness of the third spin-on hard mask layer 140 becomes different radially from the central portion of the substrate 100 to the edge portion of the substrate 100, may occur. Generally, the dummy patterns or the align patterns in the scribe lane region B may include patterns extended in the second direction, and accordingly, radial defects may frequently occur.

However, in an example embodiment of the present inventive concept, on the substrate 100 of the main chip region A and the scribe lane region B, all of the first structure, the second spacer 130a, the first dummy patterns 130b and the align key pattern 130c may extend in the first direction and may be repeatedly arranged while being separated from each other with a certain gap. The second spacer 130a, the first dummy patterns 130b and the align key pattern 130c may have a repeating pattern of lines and spaces. For example, line patterns extending in the second direction might not be provided on the substrate 100 of the main chip region A and the scribe lane region B. Accordingly, the resistance may act the same over the entire region of the substrate 100 during the performance of the spin coating of the third spin-on hard mask layer 140 on the substrate 100.

In addition, since line patterns extending in the second direction might not be formed on the substrate 100, low resistance may be applied during flowing the spin-on hard mask material during the process of spin coating of the third spin-on hard mask layer 140. Accordingly, the third spin-on hard mask layer 140 may be formed into a substantially uniform thickness over the entire region of the substrate 100, and the radial defects may be reduced.

In addition, according to the formation of the second spacer 130a, the first dummy patterns 130b and the align key pattern 130c, extending in the first direction and repeatedly arranged while being separated from each other by a certain gap in the main chip region A and the scribe lane region B, the third spin-on hard mask layer 140 may be formed with a substantially uniform thickness at the center, edge and corner portion of each cell block region in the main chip area A.

On the third spin-on hard mask layer 140, a fourth separation layer 142 may be formed. The fourth separation layer 142 may include silicon oxynitride. The fourth separation layer 142 may be provided as an anti-reflective layer.

Figure 14:
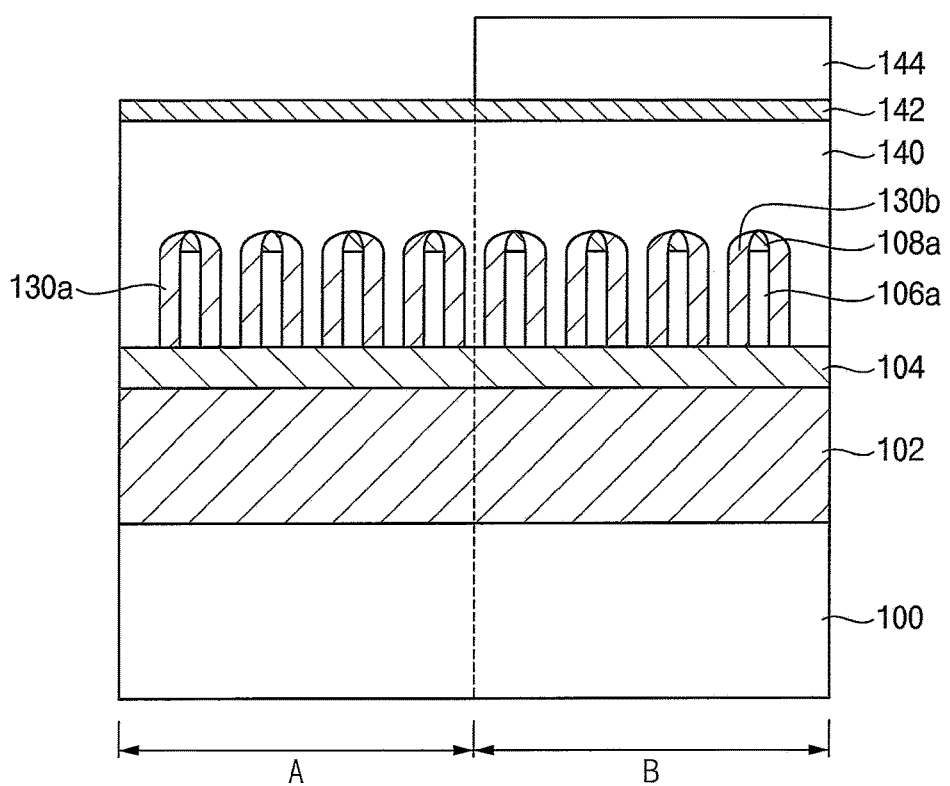

Referring to FIG. 14, a second photoresist pattern 144 may be formed on the fourth separation layer 142. The second photoresist pattern 144 may cover a portion of the main chip region A and the scribe lane region B.

In an example embodiment of the present inventive concept, the second photoresist pattern 144 may selectively expose the cell block region in the main chip region A.

Figure 15:
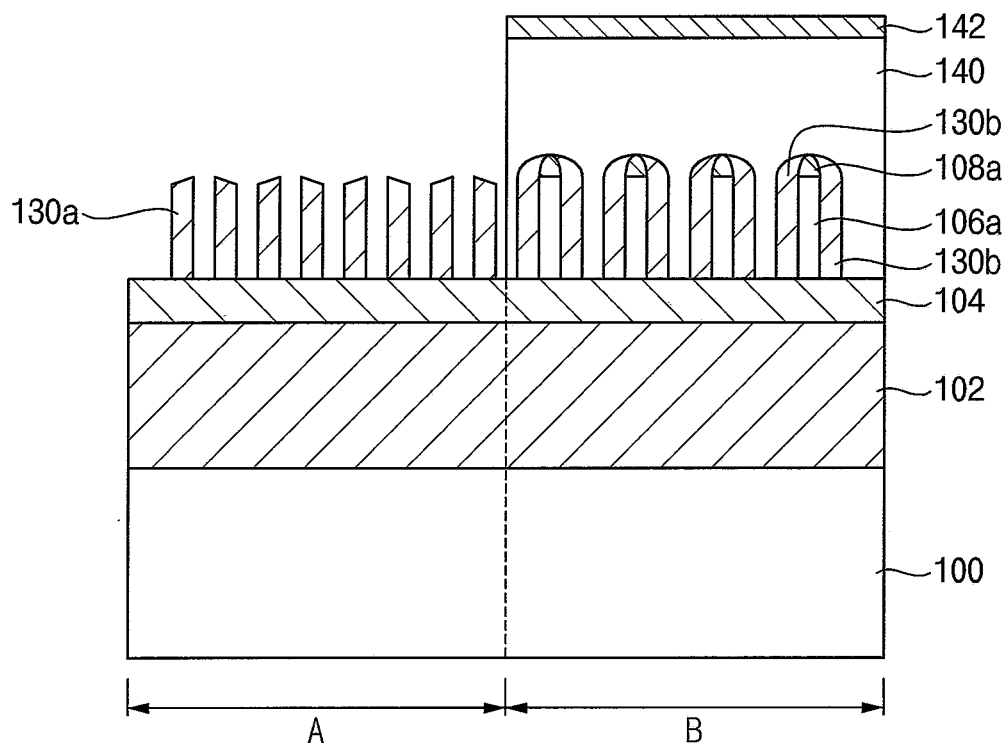

Referring to FIG. 15, the fourth separation layer 142 may be etched using the second photoresist pattern 144 as an etching mask. The third spin-on hard mask layer 140 may be etched. For example, the third spin-on hard mask layer 140 may be removed from the main chip region A and may remain in the scribe lane region B. In addition, the second separation layer pattern 108a and the second mandrel pattern 106a may be etched.

By performing the process, the second spacers 130a may remain on the first separation layer 104 in the main chip region A. The second spacer 130a may have a repeating configuration of lines and spaces. In the scribe lane region B, the second photoresist pattern 144 may be mostly removed, and the third spin-on hard mask layer 140 may cover the scribe lane region B.

If the third spin-on hard mask layer 140 does not have a substantially uniform thickness on the entire surface of the substrate 100 and at each portion in the main chip region A, the depth etched during the etching process may become different in each region, and substantially uniform etching might not be achieved. However, as explained above, since the third spin-on hard mask layer 140 is formed to have a substantially uniform thickness on the substrate 100 and each portion in the main chip region A, defects due to the thickness difference of the third spin-on hard mask layer 140 may be reduced.

Figure 16:
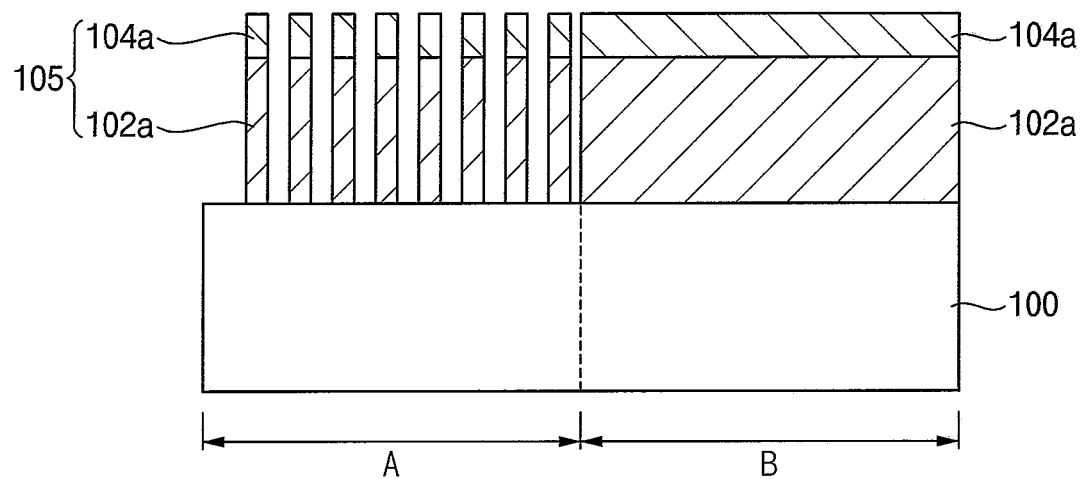

Referring to FIG. 16, the first separation layer 104 and the first mask layer 102 in the main chip region A may be etched using the second spacer 130a as an etching mask. Accordingly, a mask structure 105, in which the first mask pattern 102a and the first separation layer pattern 104a are stacked on each other, may be formed in the main chip region A.

During performing the etching process, since the scribe lane region B is covered with the third spin-on hard mask layer 140, the first separation layer 104 and the first mask layer 102 of the scribe lane region B might not be removed. In an example embodiment of the present inventive concept, portions of the first separation layer 104 and the first mask layer 102 may be removed during the etching process.

During the etching process, the third spin-on hard mask layer 140 and the second spacer 130a in the scribe lane region B may be mostly removed.

In an example embodiment of the present inventive concept, the mask structure 105 may be provided as an etching mask for forming line-shape patterns extending in the first direction in a semiconductor device. For example, the mask structure 105 may be an etching mask for forming a buried gate structure of a DRAM device.

Figure 17:
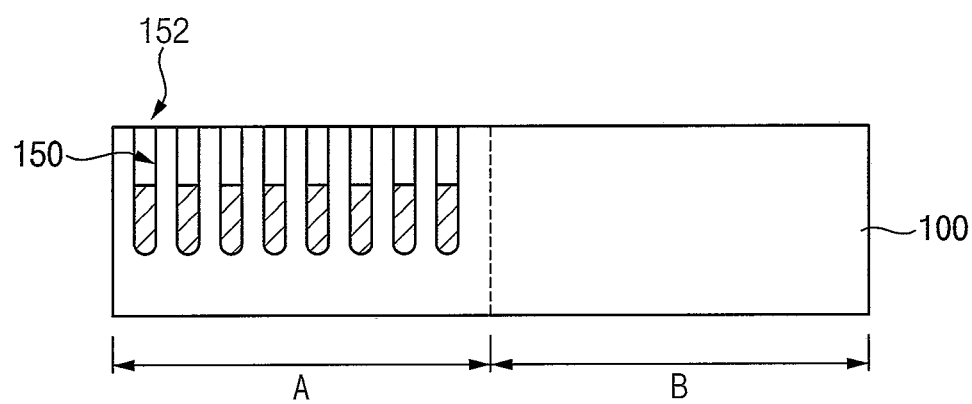

Referring to FIG. 17, the substrate 100 may be etched using the mask structure 105, the first mask layer 102 and the first separation layer 104 as an etching mask to form a recess 150, and a gate structure 152 may be formed in the recess 150.

The gate structure 152 may include a gate insulating layer, a gate electrode and a capping layer pattern.

The gate structure 152 may have a line shape extending in the first direction, and the gate structures 152 may be separated from each other by a constant gap.

By performing the process, patterns including lines and spaces may be formed in the main chip region A. In addition, an align key pattern 130c may be normally formed in the scribe lane region B. In the scribe lane region B, the dummy patterns and the align patterns may be formed without performing a separate photolithography process, and the process may become relatively simple.

Figure 18:
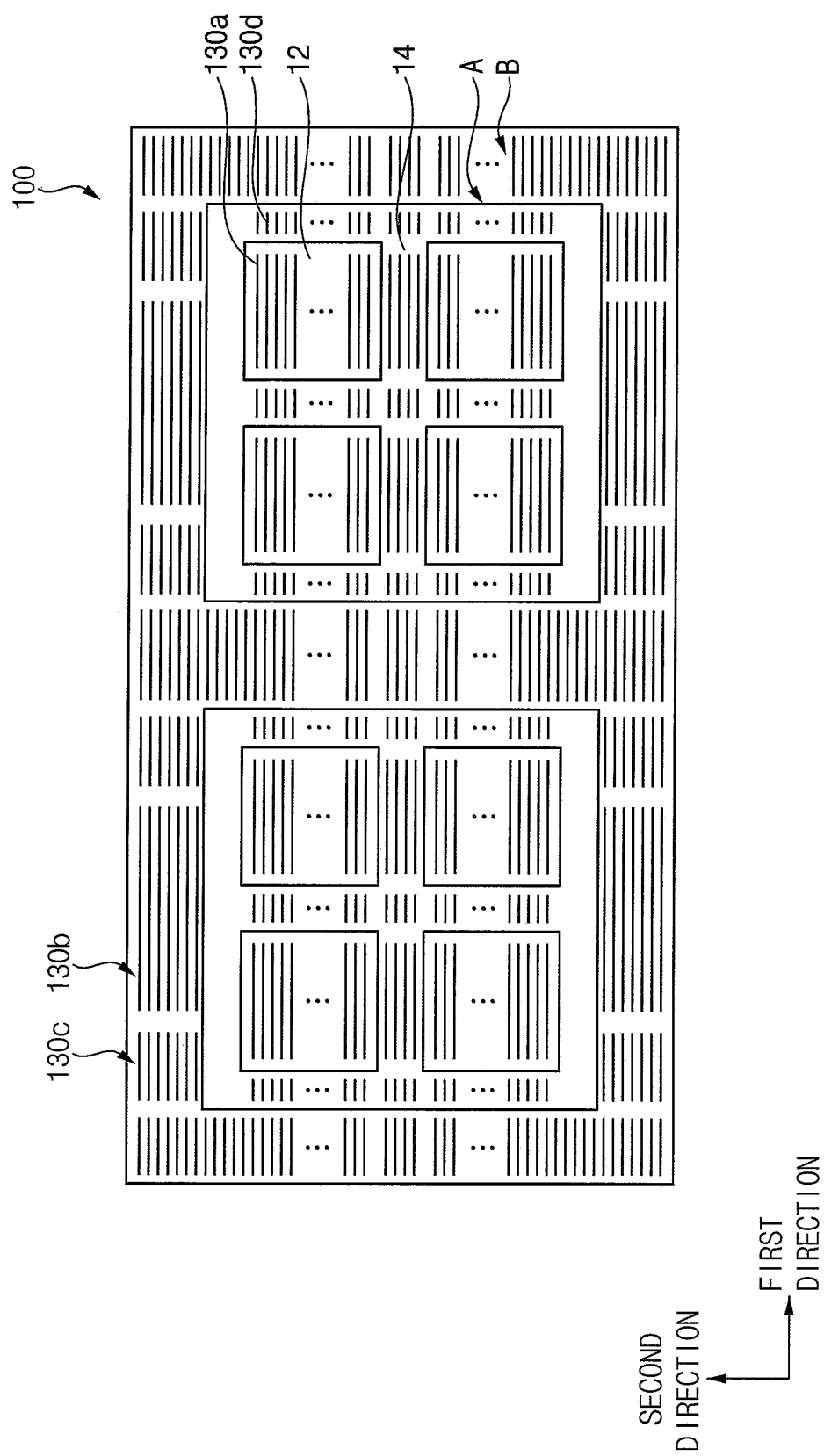
FIG. 18 is a plan view schematically showing a cell pattern structure, a dummy pattern and an align pattern, used for the manufacturing of a semiconductor device in accordance with an example embodiment of the present inventive concept.
Figure 19:
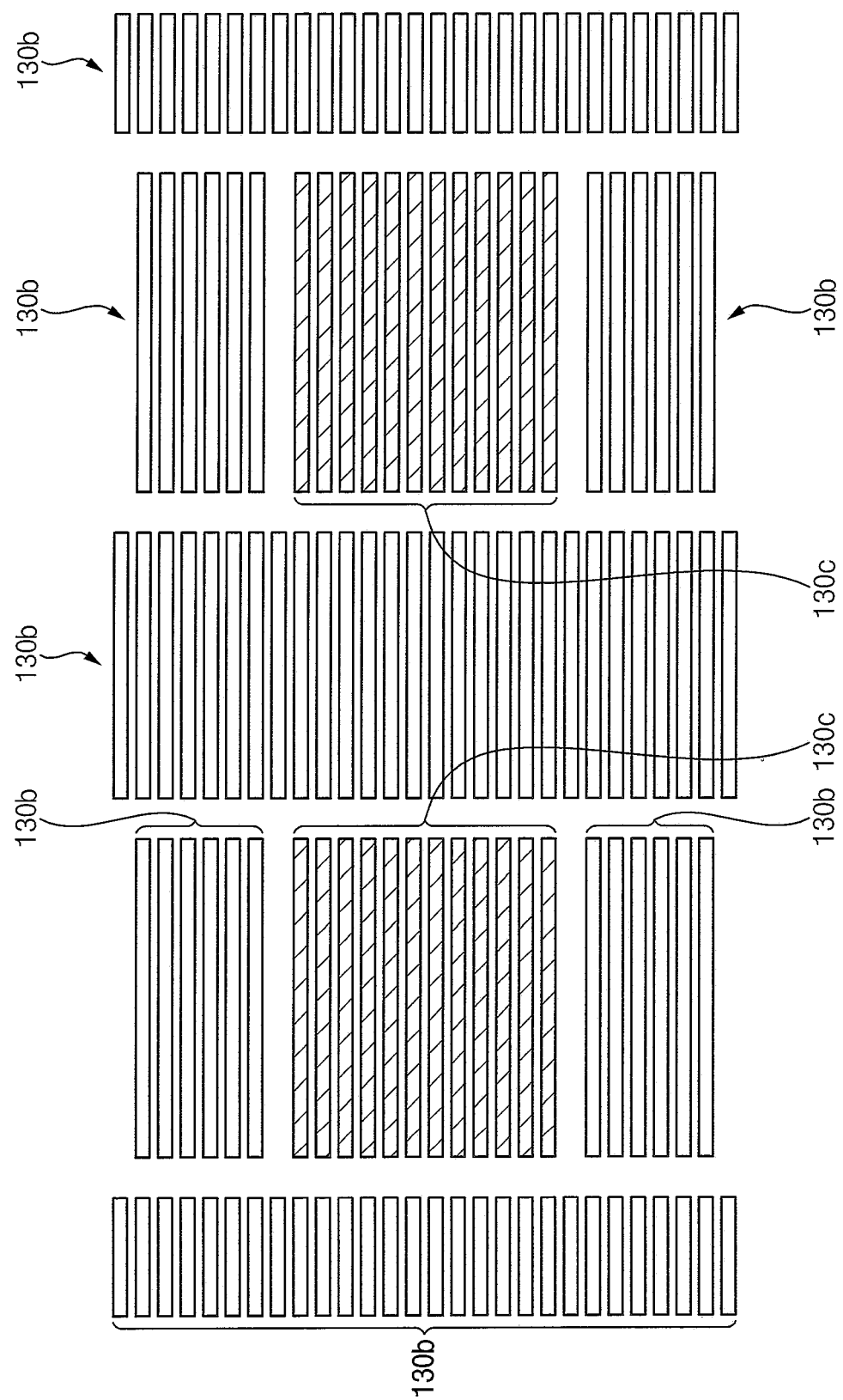
FIG. 19 is a plan view showing a dummy pattern and an align pattern, used for the manufacturing of a semiconductor device in accordance with an example embodiment of the present inventive concept.
Figure 20:
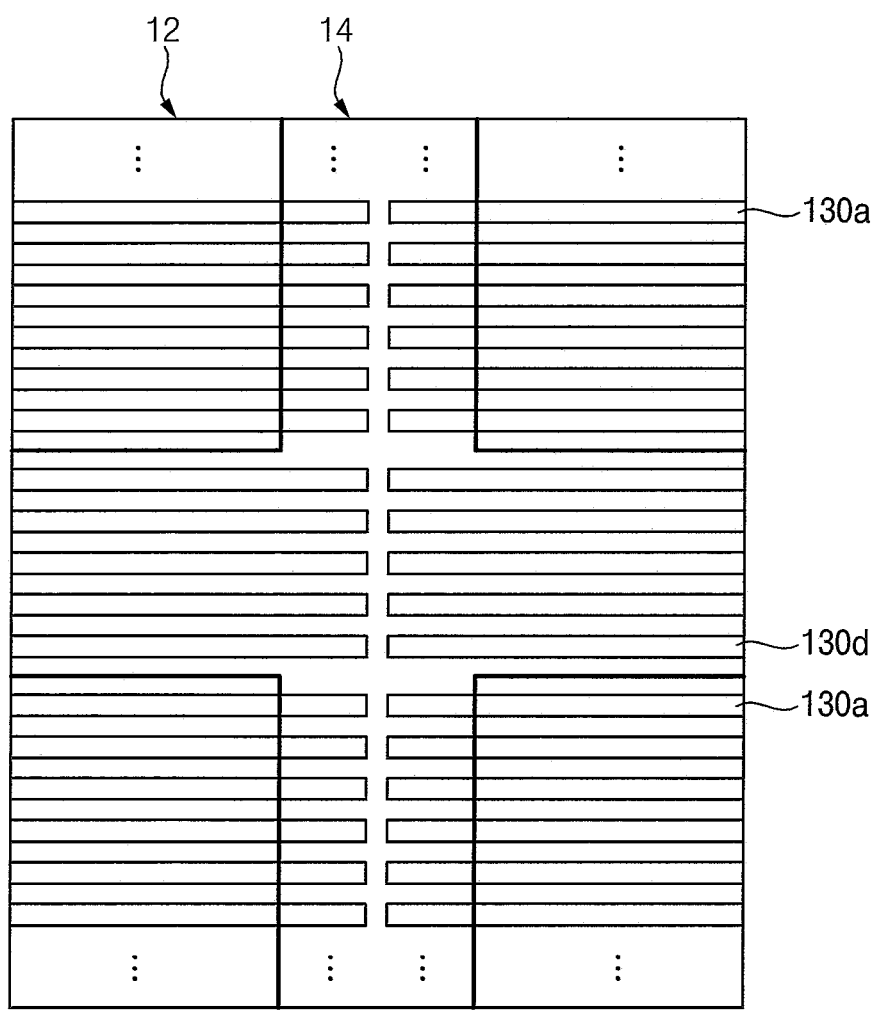
FIG. 20 is a plan view showing a cell pattern structure and a dummy pattern in a main chip region for the manufacturing of a semiconductor device in accordance with an example embodiment of the present inventive concept.

FIG. 18 is a plan view schematically showing a cell pattern structure, a dummy pattern and an align pattern, used for the manufacturing of a semiconductor device in accordance with an example embodiment of the present inventive concept. FIG. 19 is a plan view showing a dummy pattern and an align pattern, used for the manufacturing of a semiconductor device in accordance with an example embodiment of the present inventive concept. FIG. 20 is a plan view showing a cell pattern structure and a dummy pattern in a main chip region during the manufacturing of a semiconductor device in accordance with an example embodiment of the present inventive concept.

Referring to FIG. 18 to FIG. 20, a substrate 100 including a main chip region A and a scribe lane region B is provided. A cell pattern structure formed on the main chip region A of the substrate 100 may be provided, and spacers 130a extending in a first direction are separately and repeatedly disposed.

A dummy pattern structure formed on the scribe lane region B of the substrate 100 may be provided, and first dummy patterns 130b extending in the first direction are separately and repeatedly disposed.

An align key pattern structure formed on the scribe lane region B of the substrate 100 may be provided, and align key patterns 130c extending in the first direction are separately and repeatedly disposed.

Around and/or adjacent to the align key pattern structure, the first dummy patterns 130b may be provided.

In an example embodiment of the present inventive concept, the spacer 130a, the first dummy patterns 130b and the align key patterns 130c may have repeating arrangements of lines and spaces. In an example embodiment of the present inventive concept, the line width of the spacer 130a, the line width of the first dummy pattern 130b and the line width of the align key pattern 130c may be the same as each other.

In an example embodiment of the present inventive concept, a first pitch, which is the sum of one line width of the spacer 130a and one gap of the spacer 130a, a second pitch, which is the sum of one line width of the first dummy pattern 130b and one gap of the first dummy pattern 130b, and a third pitch, which is the sum of one line width of the align key pattern 130c and one gap of the align key pattern 130c, may be the same as each other.

As shown in FIG. 20, in the main chip region A, a cell block region 12 and a cell block division region 14 may be included, and in the cell block division region 14, second dummy patterns 130d extending in the first direction may be provided. The second dummy pattern 130d may have a shape extending in the first direction. The second dummy patterns 130d may have a repeating arrangement of lines and spaces. For example, the second dummy patterns 130d may be repeatedly arranged in the first and second directions. The spacer 130a of the cell block region 12 may extend in the first direction to the cell block division region 14, and the spacer positioned in the cell block division region 14 may be provided as a portion of the second dummy pattern 130d.

In an example embodiment of the present inventive concept, the second dummy pattern 130d may have the same line width as that of the spacer 130a. In an example embodiment of the present inventive concept, the second dummy pattern 130d may have the same pitch as the spacer 130a.

While the present inventive concept has been described with reference to example embodiments thereof, it will be understood by those of ordinary skill in the art that various changes in form and details may be made thereto without departing from the spirit and scope of the present inventive concept.

What is claimed is:

1. A method of manufacturing a semiconductor device, the method comprising:
   forming a mask layer, a first separation layer, a first mandrel layer, a second separation layer and a second mandrel layer on a substrate including a main chip region and a scribe lane region;
   patterning the second mandrel layer to form second mandrel patterns that extend in a first direction and separated from each other on the main chip region and the scribe lane region;
   forming first spacers on the second mandrel patterns in the main chip region and the scribe lane region;
   removing the second mandrel patterns;
   patterning the second separation layer and the first mandrel layer by using the first spacers to form first structures that include a first mandrel pattern and a second separation layer pattern stacked on the first mandrel pattern;
   forming a second spacer layer on the first structures and on the first separation layer in the main chip region and the scribe lane region;
   anisotropically etching the second spacer layer to form second spacers on side walls of the first structures of the main chip region, and to form first dummy patterns and align key patterns on the side walls of the first structures of the scribe lane region; and
   spin-coating a spin-on hard mask layer on the first separation layer, wherein the spin-on hard mask layer covers the first structures, the first dummy patterns and the align key patterns.

2. The method of manufacturing a semiconductor device of claim 1, wherein the second mandrel patterns have the same shape and the same arrangement as each other in the main chip region and in the scribe lane region.

3. The method of manufacturing a semiconductor device of claim 1, wherein a line width of each of the second mandrel patterns is about three times a first target line width of each of the second spacers, and a gap between the second mandrel patterns is about five times the first target line width.

4. The method of manufacturing a semiconductor device of claim 1, wherein each of the second spacers, first dummy patterns and align key patterns extends in the first direction, and has a repeating arrangement of lines and spaces.

5. The method of manufacturing a semiconductor device of claim 1, wherein a line width of each of the second spacers, a line width of each of the first dummy patterns and a line width of each of the align key patterns are the same as each other.

6. The method of manufacturing a semiconductor device of claim 1, wherein a first pitch, which is the sum of one line width of a second spacer of the second spacers and one gap between the second spacers, a second pitch, which is the sum of one line width of a first dummy pattern of the first dummy patterns and one gap between the first dummy patterns, and a third pitch, which is the sum of one line width of an align key pattern of the align key patterns and one gap between the align key patterns, are the same as each other.

7. The method of manufacturing a semiconductor device of claim 1, further comprising:
forming a photoresist pattern on the spin-on hard mask layer, wherein the photoresist pattern exposes the main chip region;
removing the first structures and the spin-on hard mask layer in the main chip region by using the photoresist pattern as an etching mask; and
etching the mask layer using the second spacers in the main chip region as an etching mask to form mask patterns.

8. The method of manufacturing a semiconductor device of claim 7, further comprising:
etching the substrate using the mask patterns to form a recess; and
forming a gate structure in the recess.

9. The method of manufacturing a semiconductor device of claim 1, wherein
a cell block region and a cell block division region are in the main chip region; and
second dummy patterns are formed on the side walls of the first structure in the cell block division region.

10. The method of manufacturing a semiconductor device of claim 9, wherein the second dummy patterns extend in the first direction.

11. A method of manufacturing a semiconductor device, the method comprising:
forming a mask layer, a first separation layer, a first mandrel layer, a second separation layer and a second mandrel layer on a substrate including a main chip region and a scribe lane region;
patterning the second mandrel layer to form second mandrel patterns that extend in a first direction and separated from each other on the main chip region and the scribe lane region;
forming first spacers on the side walls of the second mandrel patterns in the main chip region and the scribe lane region, wherein the first spacers have a first target line width;
removing the second mandrel patterns;
patterning the second separation layer and the first mandrel layer using the first spacers to form first structures that include a first mandrel pattern and a second separation layer pattern stacked on the first mandrel pattern and that extend in the first direction;
forming a second spacer layer on the first structures and on the first separation layer in the main chip region and the scribe lane region;
anisotropically etching the second spacer layer to form second spacers, which have the first target line width, on side walls of the first structures of the main chip region, and to form first dummy patterns, which have the first target line width, and align key patterns, which have the first target line width, on the side walls of the first structures of the scribe lane region;
spin-coating a spin-on hard mask layer on the first separation layer, wherein the spin-on hard mask layer covers the first structures, the first dummy patterns and the align key patterns;
forming a photoresist pattern on the spin-on hard mask layer, wherein the photoresist pattern exposes the main chip region;
removing the first structures and the spin-on hard mask layer in the main chip region by using the photoresist pattern as an etching mask; and
etching the mask layer using the second spacers in the main chip region as an etching mask to form mask patterns.

12. The method of manufacturing a semiconductor device of claim 11, wherein each of the second spacers, first dummy patterns and align key patterns extends in the first direction, and has a repeating arrangement of lines and spaces.

13. The method of manufacturing a semiconductor device of claim 11, wherein a first pitch, which is the sum of one line width of a second spacer of the second spacers and one gap between the second spacers, a second pitch, which is the sum of one line width of a first dummy pattern of the first dummy patterns and one gap between the first dummy patterns, and a third pitch, which is the sum of one line width of an align key pattern of the align key patterns and one gap between the align key patterns, are the same as each other.

14. The method of manufacturing a semiconductor device of claim 11, wherein
a cell block region and a cell block division region in the main chip region; and
second dummy patterns are formed on the side walls of the first structures in the cell block division region.

15. The method of manufacturing a semiconductor device of claim 14, wherein the second dummy patterns extend in the first direction.

16. The method of manufacturing a semiconductor device of claim 14, wherein the second spacer layer is formed by an atomic layer deposition method.

* * * * *